United States Patent
Xu et al.

(10) Patent No.: US 11,488,983 B2
(45) Date of Patent: Nov. 1, 2022

(54) ARRAY SUBSTRATE, METHOD FOR MANUFACTURING THE SAME, AND DISPLAY DEVICE

(71) Applicant: BEIJING BOE TECHNOLOGY DEVELOPMENT CO., LTD., Beijing (CN)

(72) Inventors: Chen Xu, Beijing (CN); Hongfei Cheng, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 290 days.

(21) Appl. No.: 16/768,413

(22) PCT Filed: Jul. 22, 2019

(86) PCT No.: PCT/CN2019/097141
§ 371 (c)(1),
(2) Date: May 29, 2020

(87) PCT Pub. No.: WO2021/012161
PCT Pub. Date: Jan. 28, 2021

(65) Prior Publication Data
US 2021/0408074 A1     Dec. 30, 2021

(51) Int. Cl.
*H01L 27/12* (2006.01)
*H01L 29/786* (2006.01)
(Continued)

(52) U.S. Cl.
CPC ...... *H01L 27/1229* (2013.01); *H01L 27/1274* (2013.01); *H01L 29/66765* (2013.01);
(Continued)

(58) Field of Classification Search
CPC .............. H01L 27/1229; H01L 27/1274–1285
See application file for complete search history.

(56) References Cited

U.S. PATENT DOCUMENTS

2018/0342204 A1    11/2018  Minami et al.
2020/0201127 A1*   6/2020   Hara .................... H01L 27/1244

FOREIGN PATENT DOCUMENTS

CN    101789434 A    7/2010
CN    104600200 A    5/2015
(Continued)

OTHER PUBLICATIONS

PCT International Search Report, Application No. PCT/CN2019/097141, dated Apr. 10, 2020, 7 pages: with English translation.
(Continued)

*Primary Examiner* — Brigitte A Paterson
*Assistant Examiner* — Molly K Reida
(74) *Attorney, Agent, or Firm* — Armstrong Teasdale LLP (57) ABSTRACT

The present disclosure relates to an array substrate and a method for manufacturing the array substrate. The array substrate includes a substrate having a display region and a peripheral region surrounding the display region, the display region including sub-pixels arranged in an array, and a plurality of thin film transistors located on the substrate, including a plurality of first thin film transistors located within the peripheral region and a second thin film transistor located within each sub-pixel of the display region, wherein there is a first distance in a row and/or column direction between first active layers of the first thin film transistors and second active layers of nearest neighbor second thin film transistors, and there is a second distance in a row and/or column direction between adjacent second active layers, wherein the first distance is substantially equal to the second distance.

20 Claims, 5 Drawing Sheets

(51) Int. Cl.
    *H01L 29/66*    (2006.01)
    *G09G 3/20*     (2006.01)
(52) U.S. Cl.
    CPC .. *H01L 29/78669* (2013.01); *H01L 29/78678* (2013.01); *G09G 3/20* (2013.01); *G09G 2300/0408* (2013.01); *G09G 2310/0267* (2013.01); *G09G 2310/0286* (2013.01); *G09G 2310/08* (2013.01)

(56) References Cited

FOREIGN PATENT DOCUMENTS

| | | |
|---|---|---|
| CN | 105405865 A | 3/2016 |
| CN | 109727580 A | 5/2019 |

OTHER PUBLICATIONS

PCT Written Opinion, Application No. PCT/CN2019/097141, dated Apr. 10, 2020, 6 pages.: with English translation of relevant part.

\* cited by examiner

ARRAY SUBSTRATE, METHOD FOR MANUFACTURING THE SAME, AND DISPLAY DEVICE

CROSS REFERENCE TO RELATED APPLICATIONS

This patent application is a National Stage Entry of PCT/CN2019/097141 filed on Jul. 22, 2019, the disclosure of which is incorporated by reference herein in its entirety as part of the present application.

BACKGROUND

Embodiments of the present disclosure relate to the field of display technology, and particularly to an array substrate, a method for manufacturing the array substrate, and a display device.

The manufacture of an existing array substrate of a display panel mainly includes a low temperature polysilicon (LTPS) technology, an oxide technology, an amorphous silicon technology, and an organic thin film transistor technology. The LTPS technology has been widely used in the manufacturing process of the display panel. However, due to technical limitations, the LTPS technology cannot yet be applied to the manufacture of high-generation line (higher than G6) panel. Although Oxides have higher mobility, their stability and uniformity are poor, and currently mass production process is difficult. Amorphous silicon thin film transistors have low mobility and poor driving capability, so that it cannot meet the requirements of the display panel in large-size, high-resolution, or high-refresh rate.

BRIEF DESCRIPTION

Embodiments of the present disclosure provide an array substrate, a method for manufacturing the array substrate, and a display device.

A first aspect of the present disclosure provides an array substrate. The array substrate includes a substrate having a display region and a peripheral region surrounding the display region, the display region including sub-pixels arranged in an array, and a plurality of thin film transistors located on the substrate, including a plurality of first thin film transistors located within the peripheral region and a second thin film transistor located within each sub-pixel of the display region. Further, there is a first distance in a row and/or column direction between first active layers of the first thin film transistors and second active layers of nearest neighbor second thin film transistor, and there is a second distance in a row and/or column direction between adjacent second active layers, wherein the first distance is substantially equal to the second distance.

In an embodiment of the present disclosure, the first active layers and the second active layers may have substantially the same shape.

In an embodiment of the present disclosure, the first active layers and the second active layers may have substantially the same size.

In an embodiment of the present disclosure, at least one of the first active layers may include a polycrystalline semiconductor material.

In an embodiment of the present disclosure, the second active layers may include an amorphous semiconductor material.

In an embodiment of the present disclosure, the second active layer may include a polycrystalline semiconductor material.

In an embodiment of the present disclosure, at least the second active layers adjacent to the peripheral region may include a polycrystalline semiconductor material.

In an embodiment of the present disclosure, the at least one of the first active layers and/or the second active layers may include a stack structure which may include a first semiconductor layer containing the polycrystalline semiconductor material, a second semiconductor layer containing an amorphous semiconductor material, and a third semiconductor layer containing an amorphous semiconductor material and being located at an opposite end of the second semiconductor layer sequentially arranged in a direction perpendicular to the array substrate and away from a gate electrode of the thin film transistor. Further, the third semiconductor layer may have a higher carrier concentration than that of the second semiconductor layer.

In an embodiment of the present disclosure, the gate electrode of the thin film transistor may be located between the active layer and the substrate of the thin film transistor.

In an embodiment of the present disclosure, the peripheral region may include at least one driving circuit. The driving circuit may include a first sub-thin film transistor, a gate electrode and a first source/drain electrode of the first sub-thin film transistor being coupled to a data input terminal, and a second source/drain electrode of the first sub-thin film transistor being coupled to a first node, a second sub-thin film transistor, a gate electrode of the second sub-thin film transistor being coupled to a reset terminal, a first source/drain electrode of the second sub-thin film transistor being coupled to the first node, and a second source/drain electrode of the second sub-thin film transistor being coupled to a first voltage terminal, a third sub-thin film transistor, a gate electrode of the third sub-thin film transistor being coupled to the first node, a first source/drain electrode of the third sub-thin film transistor being coupled to a first clock signal terminal, and a second source/drain electrode of the third sub-thin film transistor being coupled to a data output terminal, a fourth sub-thin film transistor, a gate electrode of the fourth sub-thin film transistor being coupled to a second node, a first source/drain electrode of the fourth sub-thin film transistor being coupled to a third node, and a second source/drain electrode of the fourth sub-thin film transistor being coupled to a second clock signal terminal, a fifth sub-thin film transistor, a gate electrode of the fifth sub-thin film transistor being coupled to the first node, a first source/drain electrode of the fifth sub-thin film transistor being coupled to the third node, and a second source/drain electrode of the fifth sub-thin film transistor being coupled to the first voltage terminal, a sixth sub-thin film transistor, a gate electrode of the sixth sub-thin film transistor being coupled to the second clock signal terminal, a first source/drain electrode of the sixth sub-thin film transistor being coupled to the data input terminal, and a second source/drain electrode of the sixth sub-thin film transistor being coupled to the first node, a seventh sub-thin film transistor, a gate electrode of the seventh sub-thin film transistor being coupled to the first node, a first source/drain electrode of the seventh sub-thin film transistor being coupled to the second node, and a second source/drain electrode of the seventh sub-thin film transistor being coupled to the first voltage terminal, an eighth sub-thin film transistor, a gate electrode and a first source/drain electrode of the eighth sub-thin film transistor being coupled to the second clock signal terminal, and a second source/drain electrode of the eighth sub-thin film transistor being coupled to the second node, a ninth sub-thin film transistor, a gate electrode of the ninth sub-thin film transistor being coupled to the third node, a first source/drain electrode of the ninth sub-thin film transistor being coupled to the first node, and a second source/drain electrode of the ninth sub-thin film transistor being coupled to the first voltage terminal, a tenth sub-thin film transistor, a gate electrode of the tenth sub-thin film transistor being coupled to the third node, a first source/drain electrode of the tenth sub-thin film transistor being coupled to the data output terminal, and a second source/drain electrode of the tenth sub-thin film transistor being coupled to the first voltage terminal, an eleventh sub-thin film transistor, a gate electrode of the eleventh sub-thin film transistor being coupled to the second clock signal terminal, a first source/drain electrode of the eleventh sub-thin film transistor being coupled to the data output terminal, and a second source/drain electrode of the eleventh sub-thin film transistor being coupled to the first voltage terminal, and a capacitor, a first electrode of the capacitor being coupled to the first node, and a second electrode of the capacitor being coupled to the data output terminal.

In an embodiment of the present disclosure, a width-to-length ratio of an active layer of the seventh sub-thin film transistor may be configured to be smaller than that of an active layer of the eighth sub-thin film transistor.

In an embodiment of the present disclosure, the at least one of the first active layers may include active layers of the first sub-thin film transistor to the eleventh sub-thin film transistor.

In an embodiment of the present disclosure, an active layer of the third sub-thin film transistor may have a stack structure. The sub-thin film transistor may include a first semiconductor layer containing the polycrystalline semiconductor material, a second semiconductor layer containing an amorphous semiconductor material, and a third semiconductor layer containing an amorphous semiconductor material and being located at an opposite end of the second semiconductor layer sequentially arranged in a direction perpendicular to the array substrate and away from a gate electrode of the thin film transistor, wherein the third semiconductor layer may have a higher carrier concentration than that of the second semiconductor layer.

A second aspect of the present disclosure provides a method for manufacturing the array substrate. The method includes providing a substrate which has a display region and a peripheral region surrounding the display region, the display region including sub-pixels arranged in an array, and forming a plurality of thin film transistors on the substrate, the plurality of thin film transistors including a plurality of first thin film transistors located within the peripheral region and a second thin film transistor located within each sub-pixel of the display region. Further, there is a first distance in a row and/or column direction between first active layers of the first thin film transistors and second active layers of nearest neighbor second thin film transistors, and there is a second distance in a row and/or column direction between adjacent second active layers, wherein the first distance is substantially equal to the second distance.

In an embodiment of the present disclosure, forming the plurality of thin film transistors may include forming a semiconductor layer containing an amorphous semiconductor material on the substrate, the semiconductor layer including first portions in an one-to-one correspondence to the first active layers and second portions in an one-to-one correspondence to the second active layers, and converting the amorphous semiconductor material contained in at least one of the first portions into a polycrystalline semiconductor material.

In an embodiment of the present disclosure, the method may further include converting at least the amorphous semiconductor material contained in the second portions adjacent to the peripheral region into the polycrystalline semiconductor material.

In an embodiment of the present disclosure, the converting may include laser annealing.

In an embodiment of the present disclosure, the converting may include performing, using a mask, a laser annealing treatment on the semiconductor layer. Further, the mask may have openings in an one-to-one correspondence to the sub-pixels arranged in an array, and microlenses in an one-to-one correspondence to the openings and being aligned with the openings in a light transmission direction.

In an embodiment of the present disclosure, the semiconductor layer may be patterned to remove portions except the first portions and the second portions of the semiconductor layer and the first portions and the second portions may be shaped to form the first active layers and the second active layers.

In an embodiment of the present disclosure, the shaping is performed so that the first active layers and the second active layers may have substantially the same shape, or have substantially the same shape and size.

A third aspect of the present disclosure provides a display device. The display device includes the array substrate according to the first aspect of the present disclosure.

Further aspects and areas of applicability will become apparent from the description provided herein. It could be understood that various aspects of the present application may be implemented individually or in combination with one or more other aspects. It could also be understood that the description and specific embodiments herein are intended for purposes of illustration only and are not intended to limit the scope of the present application.

BRIEF DESCRIPTION OF THE DRAWINGS

In order to illustrate the technical solutions of embodiments of the present disclosure more clearly, drawings of the embodiments will be briefly described below. It could be appreciated that the drawings described below merely relate to some embodiments of the present disclosure, rather than limiting the present disclosure, wherein throughout the various views of these drawings, the same reference numerals indicate the same parts or features.

DETAILED DESCRIPTION

In order to make the technical solutions and advantages of the present disclosure more clear, the technical solutions in the embodiments of the present disclosure will be clearly and completely described below in detail in conjunction with the drawings. Obviously, the embodiments described specifically herein are merely some but not all of embodiments of the present disclosure. Based on the described embodiments of the present disclosure, all other embodiments obtained by those skilled in the art without creative work fall within the protecting scope of the present disclosure.

The terms "a(an)", "one", "this", and "the" are intended to mean the presence of one or more elements when describing the elements of the present disclosure and its embodiments. The terms "comprise", "comprising", "include", "including", "contain", "containing" etc. are intended to be inclusive and to indicate that there may be additional elements except the listed elements.

For the purpose of the description below, as the indicated direction shown in the drawings, the terms "up", "down", "left", "right", "vertical", "horizontal", "top", "bottom" and their derivatives are involved in the present disclosure. The terms "overriding", "on top of", "positioned over" or "positioned on top of" means that a first element such as a first structure located on a second element such as a second structure. However, there may be an intermediate element such as an interface structure between the first element and the second element. The term "contact" means connecting the first element such as the first structure and the second element such as the second structure, and there may be other elements or may be no other elements at the interface of the two elements.

As used herein, the terms "about", "substantially", "essentially", and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology, or other statistical variation.

Unless otherwise defined, all terms (including technical and scientific terms) used herein have the same meaning as commonly understood by those skilled in the art to which the matter of the present disclosure belongs. It will be further understood that terms, such as those defined in commonly used dictionaries, should be interpreted as having meanings that are consistent with their meanings in the context of the description and the relevant technologies and will not be interpreted in an idealized or overly formal sense unless otherwise defined. As employed herein, the statement that two or more parts are "connected" or "coupled" together shall mean that the parts are joined together directly or via one or more intermediate parts.

In all embodiments of the present disclosure, since a source electrode and a drain electrode (i.e., an emitter electrode and a collector electrode) of the transistor are symmetrical and current conducting direction between a source electrode and a drain electrode (i.e., an emitter electrode and a collector electrode) of the N-type transistor and P-type transistor are inverse, in the embodiments of the present disclosure, a controlled intermediate terminal of the transistor is collectively referred to as a gate electrode, and a signal input terminal and a signal output terminal may be collectively referred to as source/drain electrodes. In addition, the terms such as "first" and "second" are only used to distinguish one component (or part of a component) from another component (or another part of the component).

Microlens array (MLA) technology may also be used to manufacture an array substrate, but MLA has many problems to be solved urgently. MLA belongs to regional crystallization technology, which requires a combination of a specific mask plate and microlens to crystallize the amorphous silicon in a specific area after heating and melting. However, the mask plate and the microlens need to be used together in the manufacturing process, and a size of the mask plate is smaller than the size of the array substrate, so illuminating multiple times are required to complete the treatment of all regions. Usually, this process can be achieved by moving the array substrate or the mask plate. However, as for a specific substrate, the shapes and positions of the active layers are diverse. For example, the pitches between the active layers in the peripheral regions and the pixel region are different or the shapes between the active layers in the peripheral region and the pixel region are also different, so that the corresponding mask plates are different and the microlenses are also different. This makes it difficult to crystallize by moving the mask plate and the microlens with a step of the relative pitch. However, the use of the plurality of mask plates and the microlenses will result in an increase in basic manufacture costs and a long manufacture process.

The present disclosure provides an array substrate on which the thin film transistors can use a single combination of the mask plate and the microlens to converse the active layers at a desired location on the array substrate. Thus, the manufacture cost and the manufacture time of the array substrate are reduced.

Figure 1:
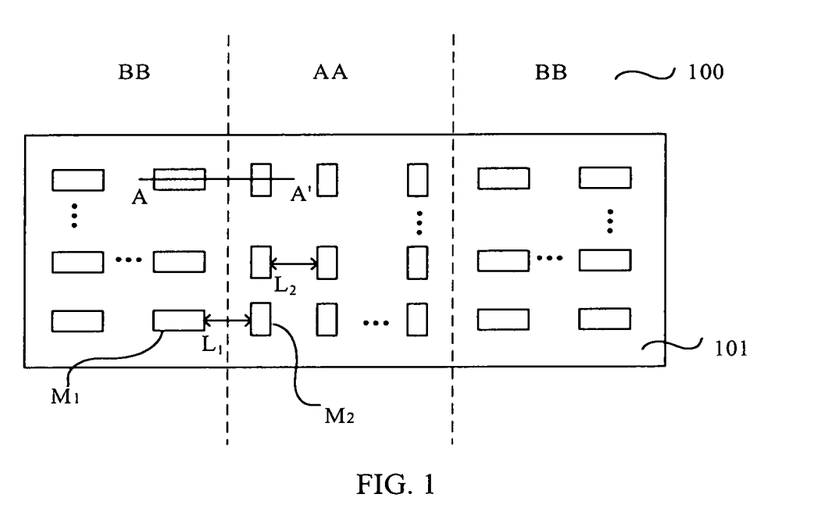
FIG. 1 is a top view of an array substrate according to an embodiment of the present disclosure.

FIG. 1 schematically shows a top view of the array substrate 100 according to an embodiment of the present disclosure. As shown in FIG. 1, the array substrate 100 may include a substrate 101. The substrate 101 may include a display region AA and peripheral regions BB located on the left and right sides of the display region AA. In addition, in the embodiment, the peripheral regions BB may be on the upper and lower sides or the four sides of the display region AA. According to an embodiment of the present disclosure, a peripheral region BB may include a Gate driver on Array (GOA) region. The array substrate may further include the thin film transistors on the substrate 101. The thin film transistors may include first thin film transistors $M_1$ located in the peripheral region BB, and second thin film transistors $M_2$ located in the display region AA. In a row direction, the first distance $L_1$ between the first active layer of the first thin film transistor $M_1$ and the second active layer of the nearest neighbor second thin film transistor $M_2$ may be substantially the same as the second distance $L_2$ between the adjacent second active layers. In the embodiment, the distance refers to the minimum distance between two components.

In other embodiments of the present disclosure, the peripheral regions BB are located on the upper and lower sides or four sides of the display region AA. In a column direction, the first distance between the first active layer and the nearest neighbor second active layer may be substantially the same as the second distance between the adjacent second active layers.

In other embodiments of the present disclosure, the peripheral regions BB are located on four sides of the display region AA. In a row direction, the first distance between the first active layer and the nearest neighbor second active layer are substantially the same as the second distance between the adjacent second active layers, and in a column direction, the first distance between the first active layer and the nearest neighbor second active layer are substantially the same as the second distance between the adjacent second active layers.

Further, in the embodiments, the first active layers and the second active layers may have substantially the same shape, such as a rectangular shape. Further, in an embodiment, the first active layers and the second active layers may have substantially the same shape and size as the second active layer. In the embodiments, the size refers to the size in the plane where the active layer is located, such as length and width.

In the embodiments of the present disclosure, the active layer of the first thin film transistor $M_1$ and the active layer of the second thin film transistor $M_2$ may be rectangular.

Figure 2:
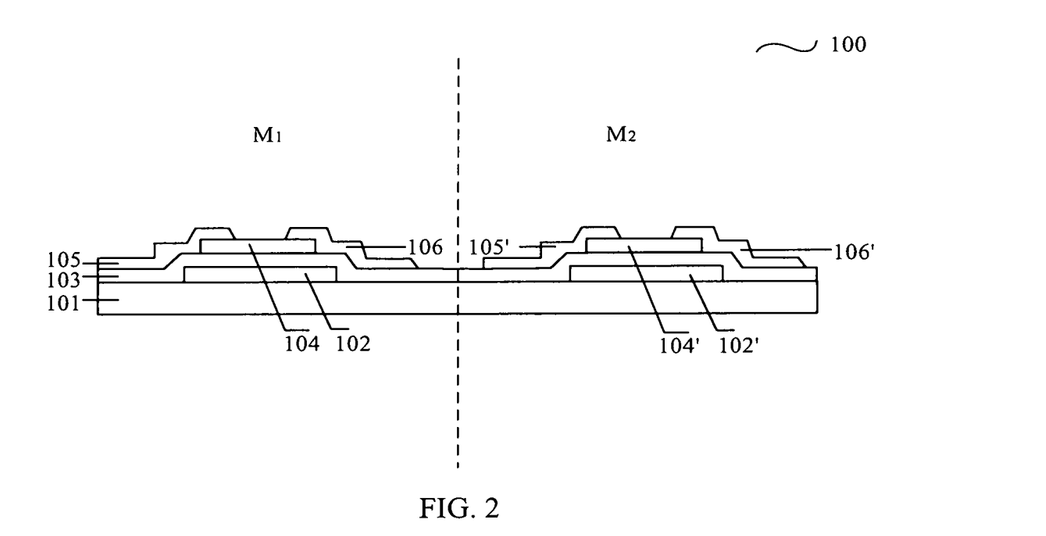
FIG. 2 is a side view of the array substrate along the AA' axis in FIG. 1 according to an embodiment of the present disclosure.

FIG. 2 schematically shows a side view of the array substrate 100 along the AA' axis in FIG. 1 according to an embodiment of the present disclosure. As shown in FIG. 2, the first thin film transistor $M_1$ may include a first gate electrode 102 located on the substrate 101, a gate insulating layer 103 located on the first gate electrode 102, the first active layer 104 located on the gate insulating layer 103, and a first source/drain electrode 105 and a second source/drain electrode 106 of the first thin film transistor $M_1$ located on the first active layer 104. The second thin film transistor $M_2$ may include a second gate electrode 102', the gate insulating layer 103 located on the second gate electrode 102', the second active layer 104' located on the gate insulating layer 103, and a first source/drain electrode 105' and a second source/drain electrode 106' of the second thin film transistor $M_2$ located on the second active layer 104'.

Generally, the active layers of the thin film transistors of the array substrate may be formed of an amorphous semiconductor material such as amorphous silicon, but a polycrystalline semiconductor material has a higher electron mobility, thus the thin film transistor has a stronger driving capability. According to the present disclosure, the amorphous semiconductor material can be crystallized with a single combination of the mask plate and the microlens to convert the amorphous semiconductor material in the required portion into the polycrystalline semiconductor material. This can reduce not only the types and the number of the mask plates and the microlenses, but also manufacture time.

In an embodiment of the present disclosure, at least one of the first active layers 104 may include the polycrystalline semiconductor material (e.g. polycrystalline silicon). The second active layer 104' may include the amorphous semiconductor material (e.g. amorphous silicon). According to the embodiment, considering the key factors affecting the driving capability and the limitations of mass production, and that the GOA circuit located in the peripheral region has greater influence on the driving capability, the driving capability of the display panel can be significantly improved by performing crystallization treatment merely on the peripheral region while keeping the active layers of the display region AA.

In other embodiments of the present disclosure, at least one of the first active layers 104 and at least one of the second active layers 104' may include the polycrystalline semiconductor material. Further, in the embodiment of the present disclosure, the second active layer 104' adjacent to the peripheral region BB may include the polycrystalline semiconductor material.

Figure 3:
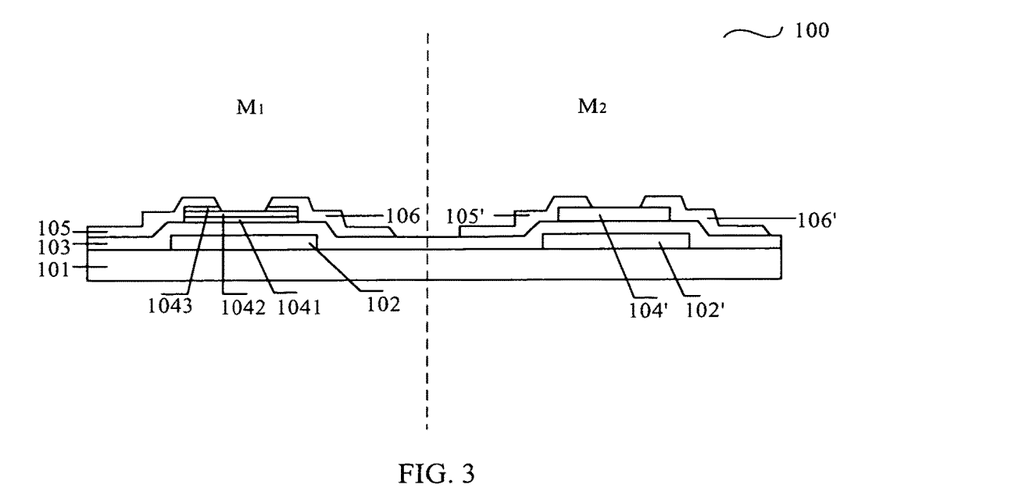
FIG. 3 is a side view of the array substrate along the AA' axis in FIG. 1 according to an embodiment of the present disclosure.

FIG. 3 schematically shows a side view of the array substrate along the AA' axis in FIG. 1 according to some embodiments of the present disclosure. Currently, some thin film transistors (e.g. driving transistors) on the array substrate require both the strong driving capability and a small leakage current in an off state. Therefore, in the embodiments of the present disclosure, an array substrate may be provided. On the array substrate, the active layer of the thin film transistor has a stack structure. The stack structure can have the small leakage current while satisfying the driving capability.

As shown in FIG. 3, the differences between FIG. 3 and FIG. 2 is that the first active layer 104 or the second active layer 104' including the polycrystalline semiconductor material has the stack structure as shown in FIG. 2. The stack structure of the active layer may sequentially include a first semiconductor layer 1041, located on the gate electrode insulating layer 103, which may contain the polycrystalline semiconductor material (e.g. polycrystalline silicon), a second semiconductor layer 1042, located on the first semiconductor layer 1041, which may contain the amorphous semiconductor material (e.g. amorphous silicon), and a third semiconductor layer 1043, located at an opposite end of the second semiconductor layer 1042, the third semiconductor layer 1043 may contain the amorphous semiconductor material, e.g. amorphous silicon. Further, in the embodiments of the present disclosure, the third semiconductor layer has a higher carrier concentration than that of the second semiconductor layer. The desired carrier concentration can be achieved by appropriate doping.

In the embodiments as shown in FIGS. 2 and 3, the thin film transistor may be a bottom-gate thin film transistor. But this is not a limitation. In the embodiments of the present disclosure, the thin film transistor may also be a top-gate thin film transistor. In this case, the active layer may be located under the gate insulating layer. The stack structure of the active layer may sequentially include a first semiconductor layer 1041 located under the gate insulating layer 103, a second semiconductor layer 1042 located under the first semiconductor layer 1041, and a third semiconductor layer 1043 located at the opposite end of the second semiconductor layer 1042.

Figure 4:
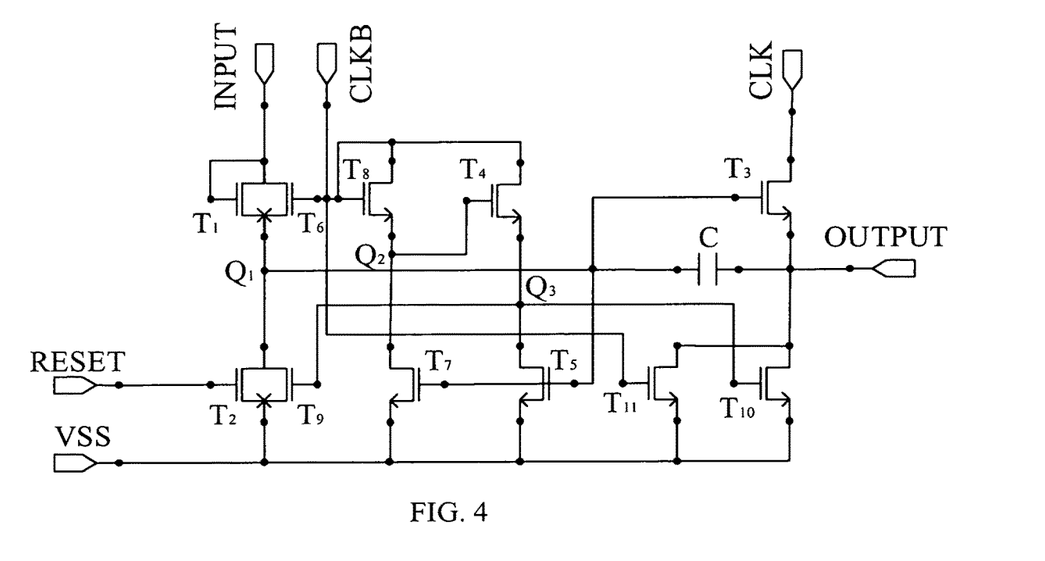
FIG. 4 is a schematic diagram of a driving circuit located in a peripheral region according to an embodiment of the present disclosure.

FIG. 4 shows a schematic diagram of a driving circuit 400 located in the peripheral region BB according to an embodiment of the present disclosure. The peripheral region BB may include at least one driving circuit 400. The driving circuit 400 will be described in detail below in conjunction with the drawing.

As shown in FIG. 4, the driving circuit 400 may include a first sub-thin film transistor $T_1$ to a eleventh sub-thin film transistor $T_{11}$ and a capacitor C. For the first sub-thin film transistor $T_1$, a gate electrode and a first source/drain electrode of the first sub-thin film transistor $T_1$ may be coupled to a data input terminal INPUT, and a second source/drain electrode of the first sub-thin film transistor $T_1$ may be coupled to a first node $Q_1$. For the second sub-thin film transistor $T_2$, a gate electrode of the second sub-thin film transistor $T_2$ may be coupled to a reset terminal RESET, a first source/drain electrode of the second sub-thin film transistor $T_2$ may be coupled to the first node $Q_1$, and a second source/drain electrode of the second sub-thin film transistor $T_2$ may be coupled to a first voltage terminal VSS. For the third sub-thin film transistor $T_3$, a gate electrode of the third sub-thin film transistor may be coupled to the first node $Q_1$, a first source/drain electrode of the third sub-thin film transistor $T_3$ may be coupled to a first clock signal terminal CLK, and a second source/drain electrode of the third sub-thin film transistor $T_3$ may be coupled to a data output terminal OUTPUT. For the fourth sub-thin film transistor $T_4$, a gate electrode of the fourth sub-thin film transistor $T_4$ may be coupled to a second node $Q_2$, a first source/drain electrode of the fourth sub-thin film transistor $T_4$ may be coupled to a third node $Q_3$, and a second source/drain electrode of the fourth sub-thin film transistor $T_4$ may be coupled to a second clock signal terminal CLKB. For the fifth sub-thin film transistor $T_5$, a gate electrode of the fifth sub-thin film transistor $T_5$ may be coupled to the first node $Q_1$, a first source/drain electrode of the fifth sub-thin film transistor $T_5$ may be coupled to the third node $Q_3$, and a second source/drain electrode of the fifth sub-thin film transistor $T_5$ may be coupled to the first voltage terminal VSS. For the sixth sub-thin film transistor $T_6$, a gate electrode of the sixth sub-thin film transistor $T_6$ may be coupled to the second clock signal terminal CLKB, a first source/drain electrode of the sixth sub-thin film transistor $T_6$ may be coupled to the data input terminal INPUT, and a second source/drain electrode of the sixth sub-thin film transistor $T_6$ may be coupled to the first node $Q_1$. For the seventh sub-thin film transistor $T_7$, a gate electrode of the seventh sub-thin film transistor $T_7$ may be coupled to the first node $Q_1$, a first source/drain electrode of the seventh sub-thin film transistor $T_7$ may be coupled to the second node $Q_2$, and a second source/drain electrode of the seventh sub-thin film transistor $T_7$ may be coupled to the first voltage terminal VSS. For the eighth sub-thin film transistor $T_8$, a gate electrode and a first source/drain electrode of the eighth sub-thin film transistor $T_8$ may be coupled to the second clock signal terminal CLKB, and a second source/drain electrode of the eighth sub-thin film transistor $T_8$ may be coupled to the second node $Q_2$. For the ninth sub-thin film transistor $T_9$, a gate electrode of the ninth sub-thin film transistor $T_9$ may be coupled to the third node $Q_3$, a first source/drain electrode of the ninth sub-thin film transistor $T_9$ may be coupled to the first node $Q_1$, and a second source/drain electrode of the ninth sub-thin film transistor $T_9$ may be coupled to the first voltage terminal VSS. For the tenth sub-thin film transistor $T_{10}$, a gate electrode of the tenth sub-thin film transistor $T_{10}$ may be coupled to the third node $Q_3$, a first source/drain electrode of the tenth sub-thin film transistor $T_{10}$ may be coupled to the data output terminal OUTPUT, and a second source/drain electrode of the tenth sub-thin film transistor $T_{10}$ may be coupled to the first voltage terminal VSS. For the eleventh sub-thin film transistor $T_{11}$, a gate electrode of the eleventh sub-thin film transistor $T_{11}$ may be coupled to the second clock signal terminal CLKB, a first source/drain electrode of the eleventh sub-thin film transistor $T_{11}$ may be coupled to the data output terminal OUTPUT, and a second source/drain electrode of the eleventh sub-thin film transistor $T_{11}$ may be coupled to the first voltage terminal VSS. For the capacitor C, a first electrode of the capacitor C may be coupled to the first node $Q_1$, and a second electrode of the capacitor C may be coupled to the data output terminal OUTPUT.

In the embodiments of the present disclosure, the active layers of the first sub-thin film transistor $T_1$ to the eleventh sub-thin film transistor $T_{11}$ in the driving circuit 400 may be all the first active layers, and may all include the polycrystalline semiconductor material.

Further, in the embodiments of the present disclosure, the active layer of the third sub-thin film transistor $T_3$ has the stack structure as shown in FIG. 3, which will be omitted.

Therefore, the driving circuit provided by the embodiments of the present disclosure has the strong driving capability, and can simultaneously satisfy the requirement of low leakage current.

Figure 5:
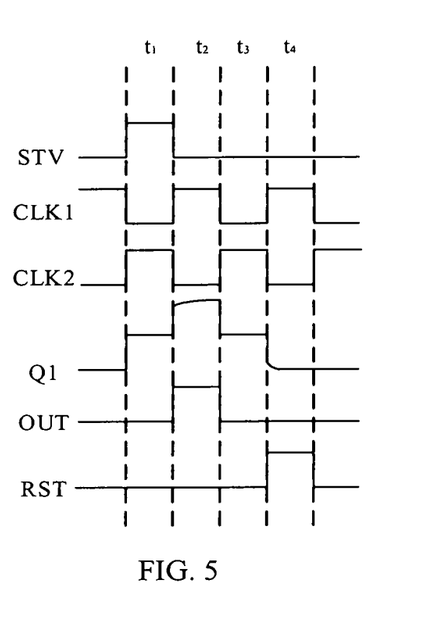
FIG. 5 is a timing diagram of various signals of the driving circuit as shown in FIG. 4.

FIG. 5 schematically shows a timing diagram of various signals of the driving circuit 400 as shown in FIG. 4. The working process of the driving circuit 400 as shown in FIG. 4 will be described in detail below in conjunction with the timing diagram as shown in FIG. 5. In the following description, it is assumed that all transistors are N-type transistors, and the first voltage signal terminal VSS outputs a signal VGL in a low level. A first clock signal CLK1 is input to the first clock signal terminal CLK. A second clock signal CLK2 is input to the second clock signal terminal CLKB. The first clock signal CLK1 and the second clock signal CLK2 have substantially the same clock period and amplitude and opposite phases. A data signal STV is input to the data input terminal INPUT. The reset terminal RESET inputs an reset signal RST. In the following embodiments, "0" indicates a voltage in a low level, and "1" indicates a voltage in a high level.

In the first stage $t_1$, STV=1, CLK1=0, CLK2=1, RST=0.

The first sub-thin film transistor $T_1$ and the sixth sub-thin film transistor $T_6$ may be turned on, the second sub-thin film transistor $T_2$ may be turned off, and a voltage of the input signal STV in a high level may be output to the first node $Q_1$. The eleventh sub-thin film transistor $T_{11}$ may be turned on, and under a control of the voltage of the first node $Q_1$ in a high level, the third sub-thin film transistor $T_3$ may be turned on, so that both the voltages of the low voltage signal VGL and the first clock signal CLK1 in a low level may be outputted to the data output terminal OUTPUT, and a voltage of OUT may be a low level. There may be a voltage difference between two electrodes of the capacitor C so as to the capacitor C be charged. The eighth sub-thin film transistor $T_8$ may be turned on, and under a control of the voltage of the first node $Q_1$ in a high level, the fifth sub-thin film transistor $T_5$ and the seventh sub-thin film transistor $T_7$ may be turned on. In the embodiment, by setting the width-to-length ratio of the seventh sub-thin film transistor $T_7$ and the eighth sub-thin film transistor $T_8$, the ratio of a resistance of the seventh sub-thin film transistor $T_7$ and a resistance of the eighth sub-thin film transistor $T_8$ may be configured, so that a voltage of second node $Q_2$ may in a low level. For example, the width-to-length ratio of the active layer of the seventh sub-thin film transistor $T_7$ is set to larger than that of the active layer of the eighth sub-thin film transistor $T_8$, that is, the resistance of the seventh sub-thin film transistor $T_7$ is smaller than that of the eighth sub-thin film transistor $T_8$. Moreover, under the control of the voltage of the second node $Q_2$ in a low level, the fourth sub-thin film transistor $T_4$ may be turned off. Based on the fourth sub-thin film transistor $T_4$ being turned off and the fifth sub-thin film transistor $T_5$ being turned on, a voltage of the third node $Q_3$ may be in a low level. Under a control of the voltage of the third node $Q_3$ in a low level, the ninth sub-thin film transistor $T_9$ and the tenth sub-thin film transistor $T_{10}$ may be turned off.

In the second stage $t_2$, STV=0, CLK1=1, CLK2=0, RST=0.

Between the second stage $t_2$ and the first stage $t_1$, the working processes of the driving circuit differ in that the first sub-thin film transistor $T_1$ and the sixth sub-thin film transistor $T_6$ may be turned off, and the voltage of the first node $Q_1$ may keep in a high level. Under the control of the voltage of the first node $Q_1$ in a high level, the third sub-thin film transistor $T_3$ may be turned on, and a voltage of the first clock signal CLK1 in a high level may be output to the data output terminal OUTPUT. Moreover, the eleventh sub-thin film transistor $T_{11}$ may be turned off, so that the voltage of the output signal OUT may be in a high level. Due to the bootstrap effect of the capacitor C, the voltage of the first node $Q_1$ may be further increased.

In the third stage $t_3$, STV=0, CLK1=0, CLK2=1, RST=0.

Between the third stage $t_3$ and the first stage $t_1$, the working processes of the driving circuit differ in that the first sub-thin film transistor $T_1$ may be turned off. The voltage of the first node $Q_1$ may still keep in a high level. Under the control of the voltage first node $Q_1$ in a high level, the third sub-thin film transistor $T_3$ may be turned on, the voltage of the first clock signal CLK1 in a low level may be outputted as the output signal OUT, that is, the voltage of the output signal OUT is in a low level. In the fourth stage $t_4$, STV=0, CLK1=1, CLK2=0, RST=1.

In the fourth stage $t_4$, the first sub-thin film transistor $T_1$ and the sixth sub-thin film transistor $T_6$ may be turned off. The reset terminal RESET of the driving circuit may be coupled to the output terminal of the driving circuit at a next level. In this stage, the voltage of the output signal of the driving circuit at the next level may be in a high level, therefore, a voltage of the reset signal RST of the driving circuit may be in a high level. Under a control of the voltage reset signal RST in a high level, the second sub-thin film transistor $T_2$ may be turned on. Thus, the voltage VGL in a low level may be output to the first node $Q_1$, so that the voltage of the first node $Q_1$ may in a low level. Under the control of the voltage of the first node $Q_1$ in a low level, the third sub-thin film transistor $T_3$, the fifth sub-thin film transistor $T_5$, and the seventh sub-thin film transistor $T_7$ may be turned off. The eighth sub-thin film transistor $T_8$ may be turned off, and the voltage of the second node $Q_2$ may be in a low level. Under the control of the voltage of the second node $Q_2$ in a low level, the fourth sub-thin film transistor $T_4$ may be turned off, so that the voltage of the third node $Q_3$ may keep in a low level. Under the control of the voltage of the third node $Q_3$ in a low level, the ninth sub-thin film transistor $T_9$ and the tenth sub-thin film transistor $T_{10}$ may be turned off. Moreover, the eleventh sub-thin film transistor $T_{11}$ may be turned off, so the data output terminal OUTPUT is in a floating state. The load coupled to the data output terminal OUTPUT is great, so the voltage of OUT may be in a low level. Both voltages of the two electrodes of the capacitor C may be in a low level, thus the capacitor C may be discharged.

Figure 6:
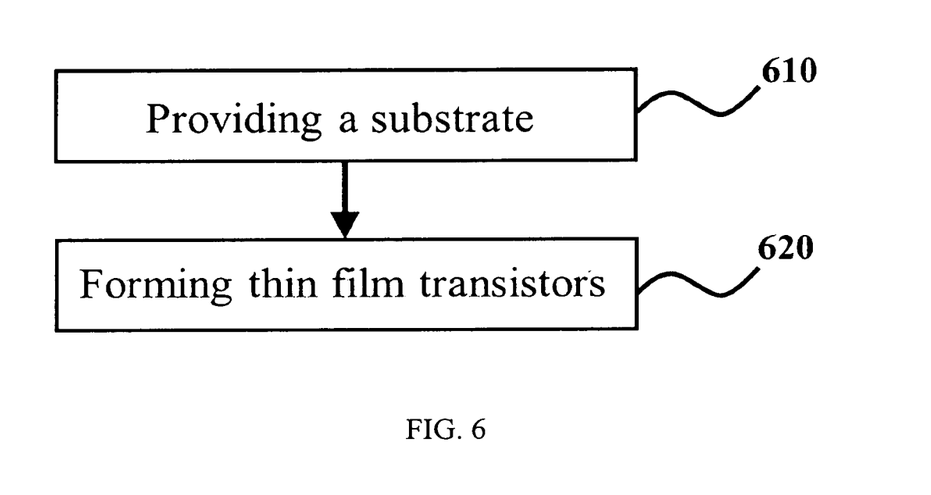
FIG. 6 is a flowchart of a method for manufacturing the array substrate according to an embodiment of the present disclosure.

FIG. 6 schematically shows a flowchart of a method for manufacturing the array substrate according to an embodiment of the present disclosure. The manufacturing method will be described in detail below in conjunction with the drawing.

As shown in FIG. 6, at step 610, the substrate 101 may be provided. The substrate 101 may include the display region AA and the peripheral region BB surrounding the display region AA. The display region AA may include the sub-pixels arranged in an array. At step 620, the thin film transistors may be formed on the substrate 101. The thin film transistors may include a plurality of the first thin film transistors $M_1$ within the peripheral region BB and the second thin film transistor $M_2$ in the display region AA. Further, in the embodiment, in the row and/or column, there may be the first distance direction between the first active layer 104 of the first thin film transistor $M_1$ and the second active layer 104' of the nearest neighbor second thin film transistor $M_2$, and there may be the second distance between the adjacent second active layers 104'. Moreover the first distance may be substantially equal to the second distance. The method for forming the thin film transistor will be described below in conjunction with FIG. 7.

In the embodiments of the present disclosure, the method for manufacturing the array substrate may further include forming a passivation layer and a pixel electrode on the thin film transistor. The material in which forming the passivation layer may be $SiO_2$, $SiO_2$/SiN lamination, SiN, and SiON. The material in which forming the pixel electrode may be ITO, IZO, or a lamination of ITO-Ag-ITO. Moreover, a via may be formed in the passivation layer, so that the electrode of the thin film transistor may be coupled to the electrode of the pixel.

Figure 7:
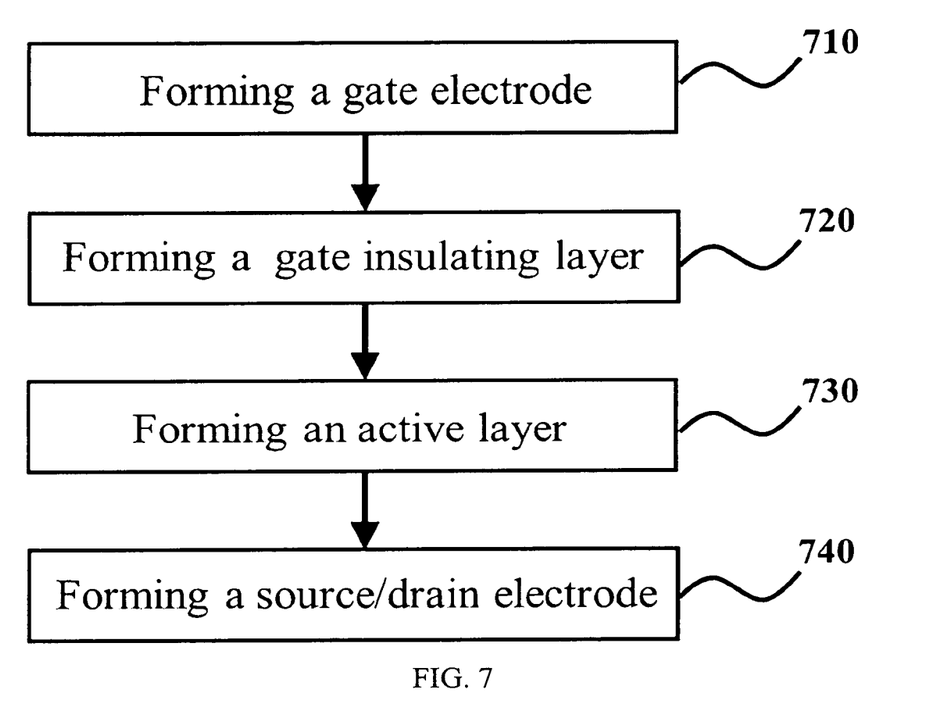
FIG. 7 is a flowchart of a method for forming a thin film transistor according to an embodiment of the present disclosure.

FIG. 7 schematically shows a flowchart of a method for forming the thin film transistor according to an embodiment of the present disclosure. As shown in FIG. 7, at step 710, a gate electrode may be formed. A metal, such as Mo, Al, Cu, and Ti, layer may be deposited on the substrate 101. Then, the first gate electrode 102 may be formed on the BB region and a second gate electrode 102' may be formed on the AA region through a patterning process.

At step 720, a gate insulating layer may be formed. An insulating material (e.g. $SiO_2$, $SiO_2$/SiN stack, SiN, and SiON) may be deposited on the first gate electrode 102, the second gate electrode 102', and the substrate 101 to form the gate insulating layer 103.

At step 730, an active layer may be formed. Firstly, a semiconductor layer containing the amorphous semiconductor material may be formed on the substrate. According to an embodiment of the present disclosure, the amorphous semiconductor material may be deposited on the gate insulating layer 103 to form the semiconductor layer. Further, the formed semiconductor layer may include first portions in an one-to-one correspondence to the first active layers 104 and second portions in an one-to-one correspondence to the second active layers 104'. Then, in the embodiments of the present disclosure, the amorphous semiconductor material contained in at least one of the first portions may be converted into the polycrystalline semiconductor material. Specifically, only the first portion of the semiconductor layer used to form the at least one of the first active layers 104 may be annealed to form a polycrystalline semiconductor layer.

Additionally, in the embodiments, the amorphous semiconductor material contained in the second portions at least adjacent to the peripheral region BB may be converted into the polycrystalline semiconductor material.

Figure 8:
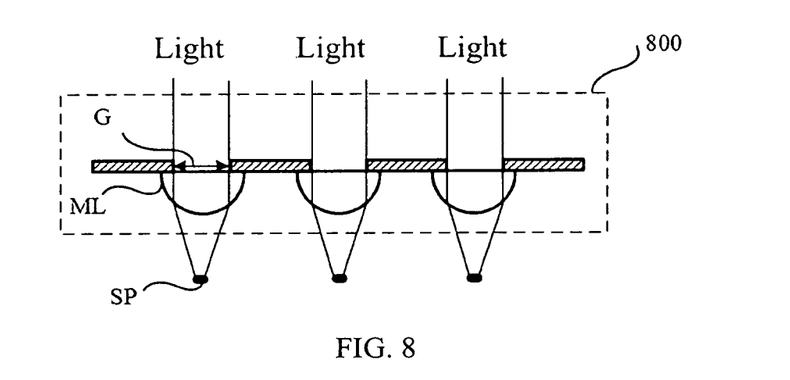
FIG. 8 is a schematic diagram of a mask according to an embodiment of the present disclosure.

Specifically, the first portions and the second portions adjacent to the peripheral region BB of the semiconductor layer may be performed the laser annealing, for example, using the single mask. In the embodiment, as shown in FIG. 8, the mask 800 may have openings G in an one-to-one correspondence to the sub-pixels SP arranged in an array and the microlenses MLA in an one-to-one correspondence to the openings G and being aligned with the openings in a light transmission direction.

Figure 9:
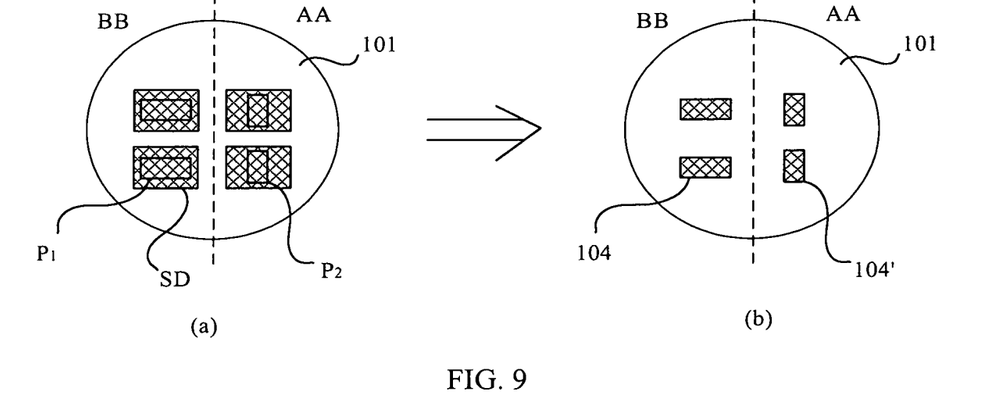
FIGS. 9A and 9B are schematic diagrams of forming an active layer by patterning according to an embodiment of the present disclosure.

Then, as shown in FIG. 9A, portions of the semiconductor layer SD except the first portions P1 and the second portions P2 of the semiconductor layer SD may be removed, so as to shape the first portions $P_1$ and the second portions $P_2$ to form the first active layer 104 and the second active layer 104' as shown in FIG. 9B. In the example of FIGS. 9A and 9B, there may be four active layers on the part of the substrate 101, and it could be understood that the present disclosure is not limited thereto.

At step 740, a source/drain electrode may be formed. A metal layer may be deposited on the first active layer 104, the second active layer 104', and the gate insulating layer 103. The material in which forming the metal layer may be substantially the same as the material in which forming the gate electrode. Then, the first source/drain electrode 105 and the second source/drain electrode 106 of the first thin film transistor $M_1$ and the first source/drain electrode 105' and the second source/drain electrode 106' of the second thin film transistor $M_2$ may be formed through the patterning process.

Alternatively, in the embodiments of the present disclosure, when the active layer is formed at step 730, firstly, the second semiconductor layer containing the amorphous semiconductor material may be formed on the first semiconductor layer in the first active layer 104 and/or the second active layer 104', which is converted into the polycrystalline semiconductor material. Specifically, the polycrystalline semiconductor layer formed by annealing the semiconductor layer SD is used as the first semiconductor layer 1041. The amorphous semiconductor material, such as amorphous silicon, with a first carrier concentration may deposited on the first semiconductor layer 1041, and then a second semiconductor layer 1042 may be formed by patterning. The third semiconductor layer 1043 containing the amorphous semiconductor material may be formed on the opposite end of the second semiconductor layer 1042. Specifically, the amorphous semiconductor material, such as amorphous silicon, with a second carrier concentration, may be deposited on the second semiconductor layer 1042 to form the third semiconductor layer 1043. In this embodiment, the first carrier concentration may be greater than the second carrier concentration.

Figure 10:
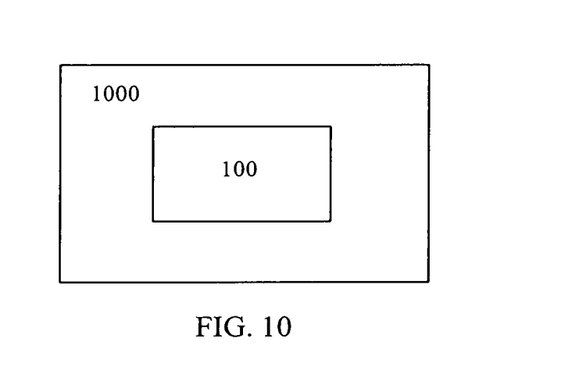
FIG. 10 is a schematic diagram of a display device according to an embodiment of the present disclosure.

FIG. 10 shows a schematic diagram of a display device 1000 according to an embodiment of the present disclosure. As shown in FIG. 10, the display device 1000 may include the array substrate 100 as shown in FIGS. 1 to 3 described above. The display panel according to the embodiments of the present disclosure may be used for any product or component with a display function. Such products or components may include but be not limited to a display device, a wearable device, a mobile phone, a tablet computer, a television set, a laptop computer, a digital photo frame, a navigator, etc.

Several embodiments according to the present disclosure have been described above, but these embodiments are presented by way of examples only, and are not intended to limit the scope of the present disclosure. In fact, the novel embodiments described herein can also be implemented in various other forms. In addition, various omissions, substitutions, and modifications in form of the embodiments described herein may be made without departing from the spirit of the present disclosure. The appended claims and their equivalents are intended to cover such forms or modifications falling within the scope and the spirit of the present disclosure.

What is claimed is:

1. An array substrate comprising:
a substrate having a display region and a peripheral region surrounding the display region, the display region comprising sub-pixels arranged in an array; and
a plurality of thin film transistors located on the substrate, the plurality of thin film transistors comprising a plurality of first thin film transistors located within the peripheral region and a second thin film transistor located within each sub-pixel of the display region, wherein there is a first distance in a row and/or column direction between first active layers of the first thin film transistors and second active layers of nearest neighbor second thin film transistors, wherein there is a second distance in a row and/or column direction between adjacent second active layers, and wherein the first distance is equal to the second distance.

2. The array substrate according to claim 1, wherein the first active layers and the second active layers have substantially the same shape.

3. The array substrate according to claim 2, wherein the first active layers and the second active layers have substantially the same size.

4. The array substrate according to claim 1, wherein at least one of the first active layers comprises a polycrystalline semiconductor material.

5. The array substrate according to claim 4, wherein the second active layers comprise an amorphous semiconductor material.

6. The array substrate according to claim 4, wherein the second active layers comprise a polycrystalline semiconductor material.

7. The array substrate according to claim 6, wherein at least the second active layers adjacent to the peripheral region comprise a polycrystalline semiconductor material.

8. The array substrate according to claim 6, wherein the at least one of the first active layers and/or the second active layers comprise a stack structure which comprises a first semiconductor layer containing the polycrystalline semiconductor material, a second semiconductor layer containing an amorphous semiconductor material, and a third semiconductor layer containing an amorphous semiconductor material and located at an opposite end of the second semiconductor layer sequentially arranged in a direction perpendicular to the array substrate and away from a gate electrode of the thin film transistor, and wherein the third semiconductor layer has a higher carrier concentration than that of the second semiconductor layer.

9. The array substrate according to claim 8, wherein the gate electrode of the thin film transistor is located between the active layer and the substrate of the thin film transistor.

10. The array substrate according to claim 4, wherein the peripheral region comprises at least one driving circuit, the driving circuit comprising:
a first sub-thin film transistor, wherein a gate electrode and a first source/drain electrode of the first sub-thin film transistor is coupled to a data input terminal, and wherein a second source/drain electrode of the first sub-thin film transistor is coupled to a first node;
a second sub-thin film transistor, wherein a gate electrode of the second sub-thin film transistor is coupled to a reset terminal, wherein a first source/drain electrode of the second sub-thin film transistor is coupled to the first node, and wherein a second source/drain electrode of the second sub-thin film transistor being is coupled to a first voltage terminal;
a third sub-thin film transistor, wherein a gate electrode of the third sub-thin film transistor is coupled to the first node, wherein a first source/drain electrode of the third sub-thin film transistor is coupled to a first clock signal terminal, and wherein a second source/drain electrode of the third sub-thin film transistor being is coupled to a data output terminal;
a fourth sub-thin film transistor, wherein a gate electrode of the fourth sub-thin film transistor is coupled to a second node, wherein a first source/drain electrode of the fourth sub-thin film transistor is coupled to a third node, and wherein a second source/drain electrode of the fourth sub-thin film transistor is coupled to a second clock signal terminal;

a fifth sub-thin film transistor, wherein a gate electrode of the fifth sub-thin film transistor is coupled to the first node, wherein a first source/drain electrode of the fifth sub-thin film transistor is coupled to the third node, and wherein a second source/drain electrode of the fifth sub-thin film transistor is coupled to the first voltage terminal;

a sixth sub-thin film transistor, wherein a gate electrode of the sixth sub-thin film transistor is coupled to the second clock signal terminal, wherein a first source/drain electrode of the sixth sub-thin film transistor is coupled to the data input terminal, and wherein a second source/drain electrode of the sixth sub-thin film transistor is coupled to the first node;

a seventh sub-thin film transistor, wherein a gate electrode of the seventh sub-thin film transistor is coupled to the first node, wherein a first source/drain electrode of the seventh sub-thin film transistor is coupled to the second node, and wherein a second source/drain electrode of the seventh sub-thin film transistor is coupled to the first voltage terminal;

an eighth sub-thin film transistor, wherein a gate electrode and a first source/drain electrode of the eighth sub-thin film transistor is coupled to the second clock signal terminal, and wherein a second source/drain electrode of the eighth sub-thin film transistor is coupled to the second node;

a ninth sub-thin film transistor, wherein a gate electrode of the ninth sub-thin film transistor is coupled to the third node, wherein a first source/drain electrode of the ninth sub-thin film transistor is coupled to the first node, and wherein a second source/drain electrode of the ninth sub-thin film transistor is coupled to the first voltage terminal;

a tenth sub-thin film transistor, wherein a gate electrode of the tenth sub-thin film transistor is coupled to the third node, wherein a first source/drain electrode of the tenth sub-thin film transistor is coupled to the data output terminal, and wherein a second source/drain electrode of the tenth sub-thin film transistor is coupled to the first voltage terminal;

an eleventh sub-thin film transistor, wherein a gate electrode of the eleventh sub-thin film transistor is coupled to the second clock signal terminal, wherein a first source/drain electrode of the eleventh sub-thin film transistor is coupled to the data output terminal, and wherein a second source/drain electrode of the eleventh sub-thin film transistor is coupled to the first voltage terminal; and a capacitor, wherein a first electrode of the capacitor is coupled to the first node, and wherein a second electrode of the capacitor is coupled to the data output terminal.

11. The array substrate according to claim 10, wherein a width-to-length ratio of an active layer of the seventh sub-thin film transistor is configured to be larger than that of an active layer of the eighth sub-thin film transistor.

12. The array substrate according to claim 11, wherein the at least one of the first active layers comprises active layers of the first sub-thin film transistor to the eleventh sub-thin film transistor.

13. The array substrate according to claim 10, wherein an active layer of the third sub-thin film transistor has a stack structure which comprises a first semiconductor layer containing the polycrystalline semiconductor material, a second semiconductor layer containing an amorphous semiconductor material, and a third semiconductor layer containing an amorphous semiconductor material and located at an opposite end of the second semiconductor layer sequentially arranged in a direction perpendicular to the array substrate and away from a gate electrode of the thin film transistor, and wherein the third semiconductor layer has a higher carrier concentration than that of the second semiconductor layer.

14. A method for manufacturing an array substrate, the method comprising:
providing a substrate which has a display region and a peripheral region surrounding the display region, the display region comprising sub-pixels arranged in an array; and
forming a plurality of thin film transistors on the substrate, the plurality of thin film transistors comprising a plurality of first thin film transistors located within the peripheral region and a second thin film transistor located within each sub-pixel of the display region,
wherein there is a first distance in a row and/or column direction between first active layers of the first thin film transistors and second active layers of nearest neighbor second thin film transistors, wherein there is a second distance in a row and/or column direction between adjacent second active layers, and wherein the first distance is equal to the second distance.

15. The method according to claim 14, wherein forming the plurality of thin film transistors comprises:
forming a semiconductor layer containing an amorphous semiconductor material on the substrate, the semiconductor layer comprising first portions in an one-to-one correspondence to the first active layers and second portions in an one-to-one correspondence to the second active layers; and
converting the amorphous semiconductor material contained in at least one of the first portions into a polycrystalline semiconductor material.

16. The method according to claim 15, further comprising converting at least the amorphous semiconductor material contained in the second portions adjacent to the peripheral region into the polycrystalline semiconductor material.

17. The method according to claim 16, wherein the converting comprises performing, using a mask, a laser annealing treatment on the semiconductor layer, and wherein the mask has openings in an one-to-one correspondence to the sub-pixels arranged in an array, and microlenses in an one-to-one correspondence to the openings and aligned with the openings in a light transmission direction.

18. The method according to claim 16, further comprising patterning the semiconductor layer to remove portions except the first portions and the second portions of the semiconductor layer and shaping the first portions and the second portions to form the first active layers and the second active layers.

19. The method according to claim 18, wherein the shaping is performed so that the first active layers and the second active layers have substantially the same shape and size.

20. A display device comprising the array substrate according to claim 1.

* * * * *

UNITED STATES PATENT AND TRADEMARK OFFICE
CERTIFICATE OF CORRECTION

| | | |
|---|---|---|
| PATENT NO. | : 11,488,983 B2 | Page 1 of 4 |
| APPLICATION NO. | : 16/768413 | |
| DATED | : November 1, 2022 | |
| INVENTOR(S) | : Chen Xu et al. | |

It is certified that error appears in the above-identified patent and that said Letters Patent is hereby corrected as shown below:

On the Title Page

Delete the illustrative print figure, figure 1, and replace with the corrected figure shown on the attached drawing sheet 1 of 5.

In the Drawings

Sheets 1, 2, and 5, delete Figures 1, 2, 3, 4, 9, and 10 and insert therefor Figures 1, 2, 3, 4, 9A, 9B, and 10 as shown on the attached drawing sheets.

Signed and Sealed this
Seventh Day of January, 2025

Derrick Brent
*Acting Director of the United States Patent and Trademark Office*

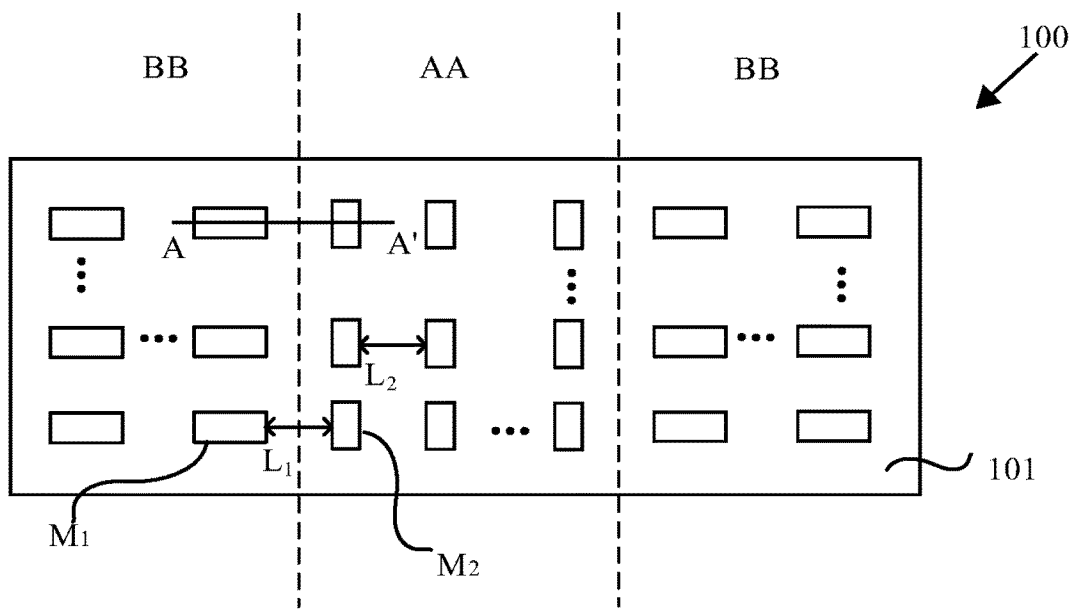
FIG. 1
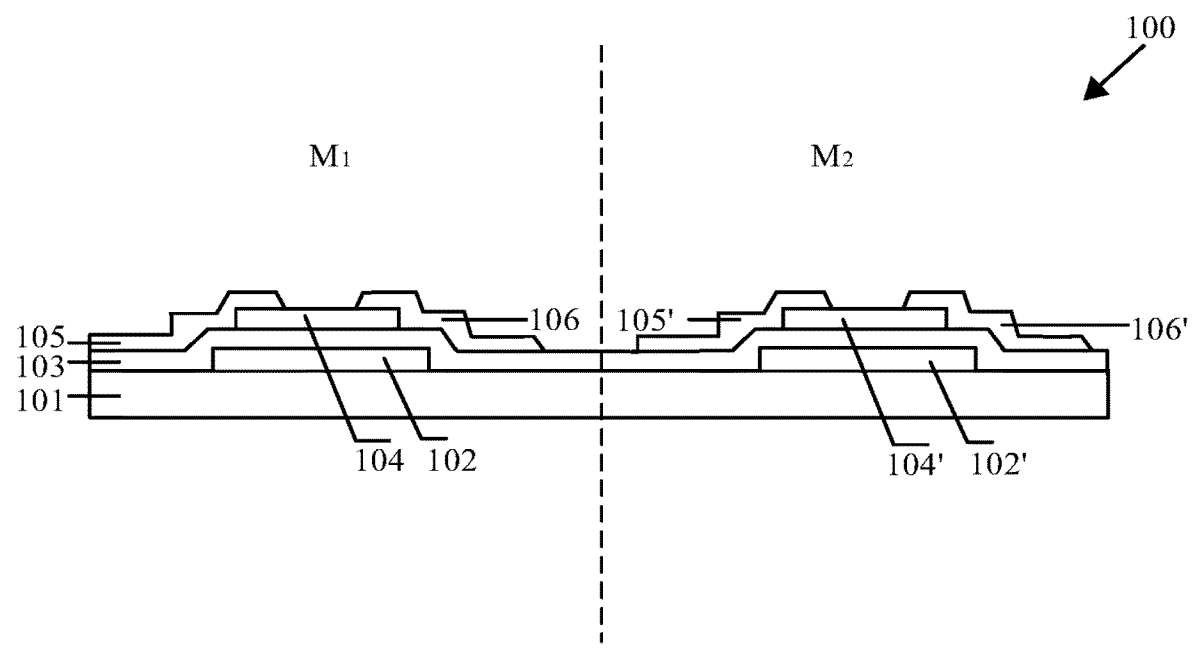
FIG. 2

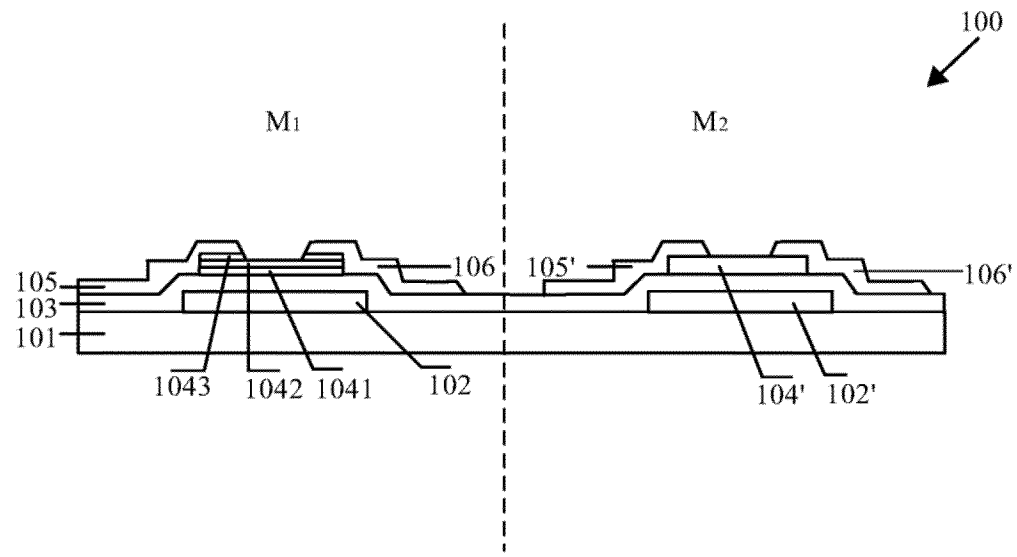
FIG. 3
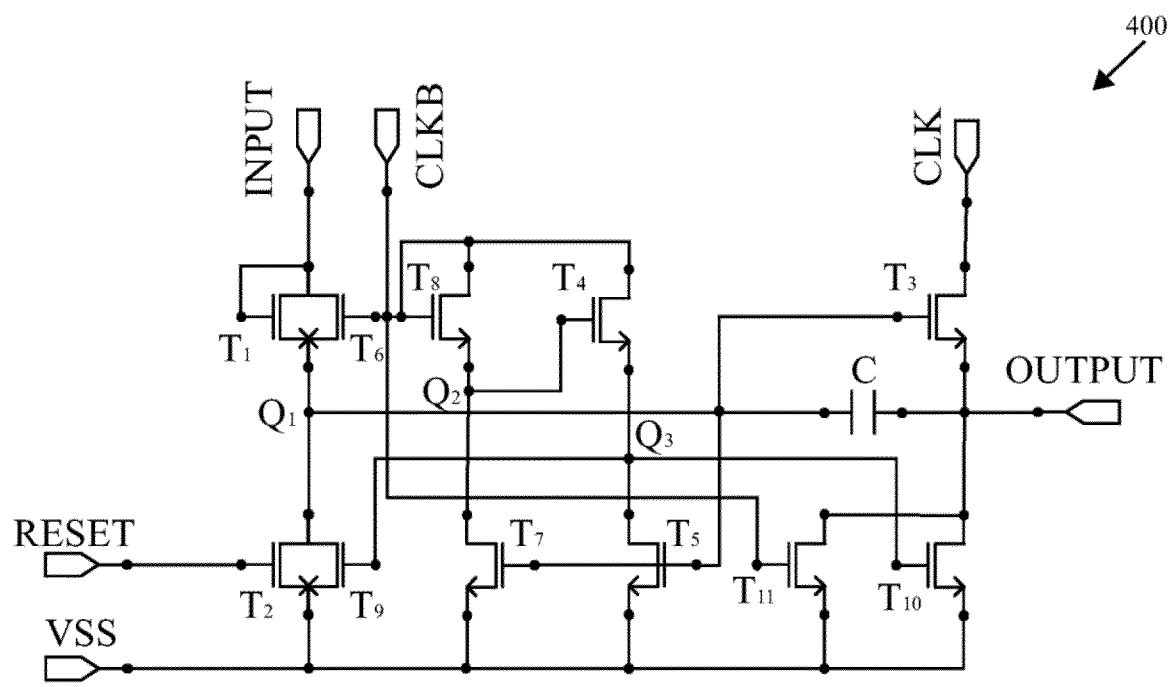
FIG. 4

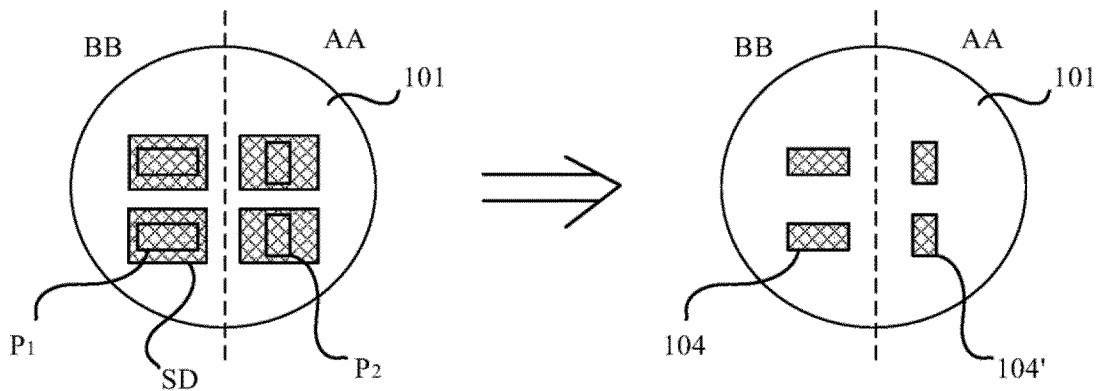
FIG. 9A  FIG. 9B
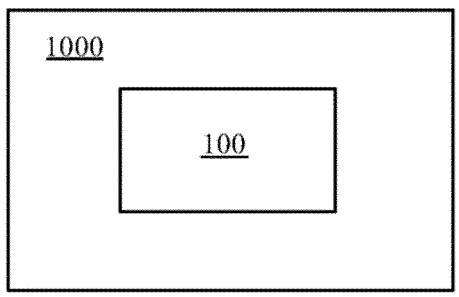
FIG. 10